United States Patent [19]

Sano

[11] Patent Number: 5,492,142
[45] Date of Patent: Feb. 20, 1996

[54] POLYCRYSTALLINE SILICON PHOTOVOLTAIC DEVICE

[75] Inventor: Keiichi Sano, Osaka, Japan

[73] Assignee: Sanyo Electric Co., Ltd., Moriguchi, Japan

[21] Appl. No.: 371,095

[22] Filed: Jan. 10, 1995

Related U.S. Application Data

[62] Division of Ser. No. 118,451, Sep. 8, 1993, Pat. No. 5,447,889.

[30] Foreign Application Priority Data

Sep. 11, 1992 [JP] Japan .................... 4-243274

[51] Int. Cl.$^6$ ................ H01L 31/04; H01L 31/0392; H01L 31/0368
[52] U.S. Cl. .................. 136/258; 148/33.2; 257/75; 437/4
[58] Field of Search .......... 136/258 PC; 257/75; 148/33.2; 437/4

[56] References Cited

U.S. PATENT DOCUMENTS

| | | | |
|---|---|---|---|
| 4,289,822 | 9/1981 | Shimada et al. | 428/212 |
| 4,737,379 | 4/1988 | Hudgens et al. | 427/575 |
| 5,017,308 | 5/1991 | Iijima et al. | 252/501.1 |
| 5,122,431 | 6/1992 | Kodama et al. | 430/128 |
| 5,133,986 | 7/1992 | Blum et al. | 427/569 |
| 5,190,838 | 3/1993 | Saitoh et al. | 430/65 |
| 5,192,991 | 3/1993 | Hosokawa | 257/51 |
| 5,213,670 | 5/1993 | Bertagnolli et al. | 204/192.25 |
| 5,221,365 | 6/1993 | Noguchi et al. | 136/258 |
| 5,238,879 | 8/1993 | Plaettner | 437/233 |
| 5,242,505 | 9/1993 | Lin et al. | 136/258 |
| 5,288,658 | 2/1994 | Ishihara | 437/101 |

FOREIGN PATENT DOCUMENTS

| | | | |
|---|---|---|---|
| 2-94625 | 4/1990 | Japan | 136/258 PC |
| 3-10075 | 1/1991 | Japan | |
| 3-218682 | 9/1991 | Japan | 136/258 PC |

OTHER PUBLICATIONS

Silicon Processing for the VLSI Era; vol. 1—Process Technology; p. 179; by Wolf et al.

*Primary Examiner*—Aaron Weisstuch
*Attorney, Agent, or Firm*—W. G. Fasse; W. F. Fasse

[57] ABSTRACT

A polycrystalline silicon film is prepared by forming an amorphous silicon film containing hydrogen and having an intensity ratio TA/TO of at least 0.5 of TA peak intensity to TO peak intensity in a Raman spectrum, and then heat treating the amorphous silicon film for converting the same to a polycrystalline silicon film. The polycrystalline silicon film has improved characteristics as a photoelectric conversion layer in a photovoltaic device.

17 Claims, 6 Drawing Sheets

POLYCRYSTALLINE SILICON PHOTOVOLTAIC DEVICE

CROSS-REFERENCE TO RELATED APPLICATIONS

This is a DIVISIONAL of U.S. Patent application Ser. No.: 08/118,451, filed: Sep. 8, 1993, now U.S. Pat. No. 5,447,889, which issued on Sep. 5, 1995.

FIELD OF THE INVENTION

The present invention relates to a polycrystalline silicon film prepared by polycrystallizing an amorphous silicon film through heat treatment.

DESCRIPTION OF THE BACKGROUND ART

In a photovoltaic device which comprises a polycrystalline semiconductor film as a photoelectric conversion layer, it is indispensable to increase the grain sizes of crystals contained in the polycrystalline semiconductor film and to improve the carrier mobility in the film, in order to improve the photoelectric conversion efficiency of the polycrystalline semiconductor film.

A typical material for such a polycrystalline semiconductor film is a polycrystalline silicon film, and a solid phase growth method has been of particular interest as a method of forming such a polycrystalline silicon film heretofore. The solid phase growth method is adapted to prepare a polycrystalline silicon film by forming an intrinsic or conductive amorphous silicon film on a substrate and heat treating this amorphous silicon film thereby polycrystallizing the film. Such a method is described in Japanese Patent Laying-Open No. 2-94625 (1990) in detail. According to the method described in this publication, an amorphous silicon film which is doped with phosphorus (P) is so heat treated as to form a polycrystalline silicon film having large grain sizes at a low temperature.

Although a polycrystalline silicon film having certain ranges of crystal grain sizes can be obtained according to said method, the crystal grain sizes are not yet sufficiently large and the carrier mobility in the known film is still insufficient.

SUMMARY OF THE INVENTION

It is an object of the present invention to provide a method of preparing a polycrystalline silicon film by heat treating an amorphous silicon film, which can achieve a polycrystalline silicon film having larger crystal grain sizes and a higher carrier mobility than heretofore.

The method according to the present invention comprises a step of forming an amorphous silicon film containing hydrogen and having an intensity ratio TA/TO of at least 0.5 of TA peak intensity to TO peak intensity in a Raman spectrum, and a step of converting the amorphous silicon film to a polycrystalline silicon film through heat treatment.

According to the present invention, the amorphous silicon film, which serves as a starting material for the polycrystalline silicon film formed by heat treatment, is prepared from an amorphous silicon containing hydrogen and having an intensity ratio TA/TO of TA peak intensity to TO peak intensity in a Raman spectrum being within a specific range. According to the present invention, it is possible to obtain a polycrystalline silicon film having large crystal grain sizes and high carrier mobility by using such a specific amorphous silicon film.

The Raman spectrum of the amorphous silicon film will now be described. In the Raman spectrum of an amorphous silicon film, peaks are widely observed within a range of about 0 to 2000 $cm^{-a}$, and two peaks of about 480 $cm^{-1}$ and about 150 $cm^{-1}$ are observed as major peaks. FIG. 7 shows a typical Raman spectrum of an amorphous silicon film. Referring to FIG. 7, two peaks of about 480 $cm^{-1}$ and about 150 $cm^{-1}$ are shown by arrows. Both of these peaks are caused by vibrations of Si-Si bonds. The peaks of about 480 $cm^{-1}$ and about 150 $cm^{-1}$ are called TO and TA peaks respectively from an analogical inference to crystal silicon, and various physical property data are obtained for the amorphous silicon film from the intensity levels of these peaks.

It is generally assumed that the amorphous silicon film has an extremely irregular structure when the TO peak has a large half band width and the TA peak intensity is at a high intensity ratio TA/TO relative to the TO peak intensity.

These peak intensity levels are varied with the method of and conditions for forming the amorphous silicon film. The amorphous silicon film shown in FIG. 7 is generally applied to a solar battery or a photoelectric conversion layer for an optical sensor. In the Raman spectrum shown in FIG. 7, the TA/TO ratio is 0.28.

BRIEF DESCRIPTION OF THE DRAWINGS

The foregoing and other objects, aspects and advantages of the present invention will become more apparent from the following detailed description of the present invention when taken in conjunction with the accompanying drawings, wherein.

DESCRIPTION OF THE PREFERRED EMBODIMENTS

Figure 1:
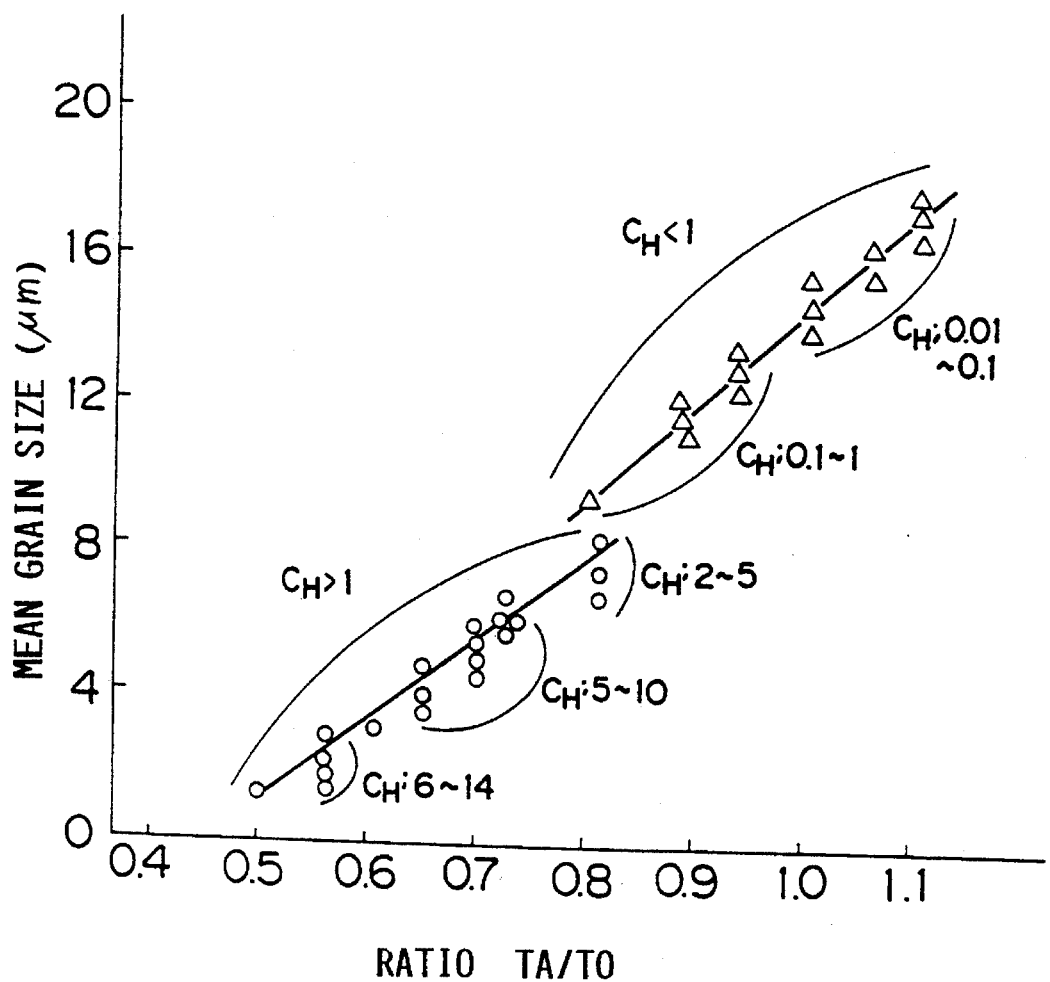
FIG. 1 shows the relationship between TA/TO ratios of amorphous silicon films and mean grain sizes of polycrystalline silicon films in Examples according to the present invention.

FIG. 1 shows intensity ratios TA/TO of TA peak intensity levels to TO peak intensity levels of amorphous silicon films according to Examples of the present invention and mean values (mean grain sizes) of crystal grain sizes in polycrystalline silicon films which were obtained from these amorphous silicon films serving as starting materials. The TA/TO ratios of the amorphous silicon films are shown along the abscissa, while the mean grain sizes are plotted along the ordinate. Symbols $C_H$ appearing in FIG. 1 represent hydrogen contents in the amorphous silicon films as an atomic percentage.

In these Examples, the amorphous silicon films were formed by plasma CVD, and supporting substrates were prepared from quartz materials having flat surfaces.

Referring to FIG. 1, each amorphous silicon film of the group having a hydrogen content $C_H$ exceeding 1 atomic percent was formed under conditions of an $SiH_4$ or $Si_2H_6$ gas flow rate of 40 to 100 sccm, a substrate temperature of 400° to 550° C., high-frequency power of 50 to 20 mW/cm², and a gas pressure of 77 to 200 Pa during the reaction. On the other hand, each amorphous silicon film of the group having a hydrogen content $C_H$ below 1 atomic percent was formed under conditions of an $SiH_4$ or $Si_2H_6$ gas flow rate of 60 to 200 sccm, a substrate temperature of 400° to 550° C., high-frequency power of 200 to 500 mW/cm² and a gas pressure of 200 to 1500 Pa during the reaction.

These amorphous silicon films were heat treated at temperatures with a range of 550° to 800° C., in non-oxidizing atmospheres in a vacuum or in nitrogen. These heat treatment conditions also apply to further Examples described below.

As to general tendencies under the aforementioned conditions, the gas pressure during reaction may be increased in order to increase the TA/TO ratio, while the substrate temperature may be set at a relatively low level in order to increase the hydrogen content, for example. Thus, it is possible to form an amorphous silicon film having the desired TA/TO ratio and hydrogen content by controlling the conditions in the aforementioned manner.

It is clearly understood from FIG. 1 that the mean grain sizes are remarkably increased as the TA/TO ratios are increased. With a TA/TO ratio of at least 0.5 the mean grain size is at least 1.3 μm, and for TA/TO ratios in the range from 0.5 to 0.8 the mean grain size is in the range from about 1.3 μm to about 8 μm, while for TA/TO ratios of at least 0.8 the mean grain size is in the range from about 9.1 μm to about 18 μm. Particularly when the TA/TO ratio is 1.1, the mean grain size is increased to about 18 μm. When the increase of the mean grain sizes is observed with regard to the hydrogen content, it is understood that the hydrogen content changes at a TA/TO ratio of 0.8. In other words, at that ratio the hydrogen content becomes greater than 1 atomic percent and is distributed within a range of 1 to 14 atomic percent in a region of the TA/TO ratios of 0.5 to 0.8, while the hydrogen content is not greater than 1 atomic percent and distributed within a range of 0.01 to 1 atomic percent in a region where the TA/TO ratios equal or exceed 0.8.

According to an experiment made by the inventors, it was impossible to obtain an amorphous silicon film which can be appreciated as a film in a region having a TA/TO ratio exceeding 0.8 and a hydrogen content exceeding 1 atomic percent in general, regardless of the method of and conditions for preparing the film.

Figure 2:
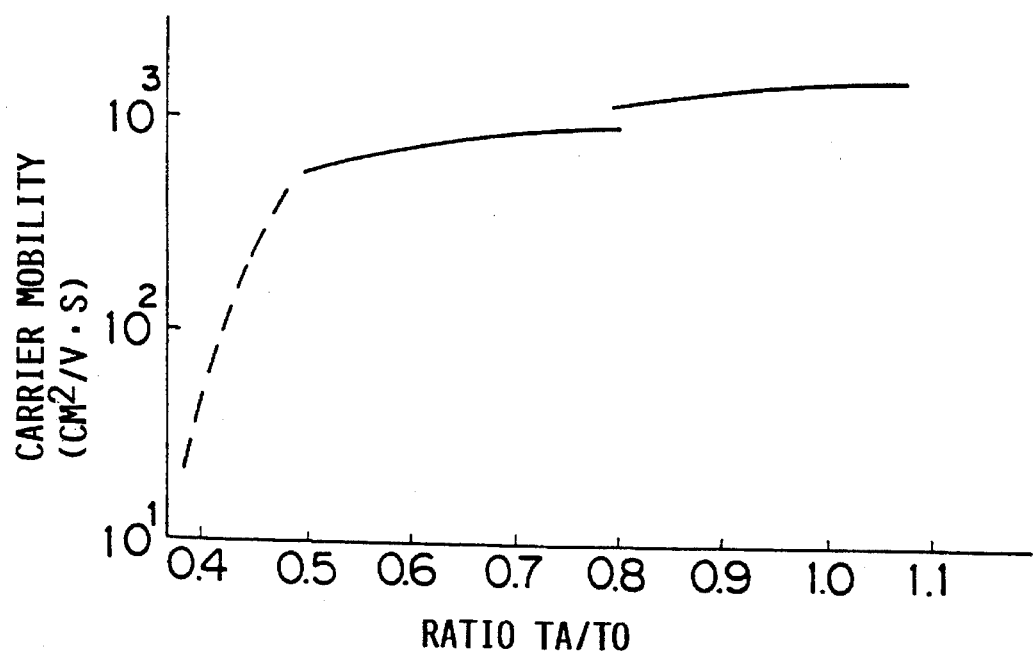
FIG. 2 shows the relationship between TA/TO ratios of amorphous silicon films and carrier mobility values of polycrystalline silicon films in Examples according to the present invention.

TA/TO ratios will now be described for amorphous silicon films serving as starting materials for polycrystalline silicon films prepared from such amorphous silicon films. The carrier mobility values of the produced polycrystalline silicon films will also be described. FIG. 2 shows relationships between such TA/TO ratios and carrier mobility values. Referring to FIG. 2, it is understood that the carrier mobility values are generally increased with TA/TO ratios in excess of 0.5. The carrier mobility is at least about $10^{2.75}$ cm²/Vs for a TA/TO ratio of at least 0.5, is in the range from about $10^{2.75}$ cm²/Vs to about $10^3$ cm²/Vs for TA/TO ratios in the range from 0.5 to 0.8 and is in the range from about $10^{3.1}$ cm²/Vs to about $10^{3.2}$ cm²/Vs for TA/TO ratios of at least 0.8. FIG. 2 also shows a boundary formed in a region of the TA/TO ratio of 0.8, similarly to FIG. 1.

As clearly understood from the aforementioned results, it is possible to prepare a polycrystalline silicon film having a large mean grain size and high carrier mobility by employing an amorphous silicon film containing hydrogen and having a TA/TO ratio of at least 0.5 as a starting material for a polycrystalline silicon film.

Figure 3:
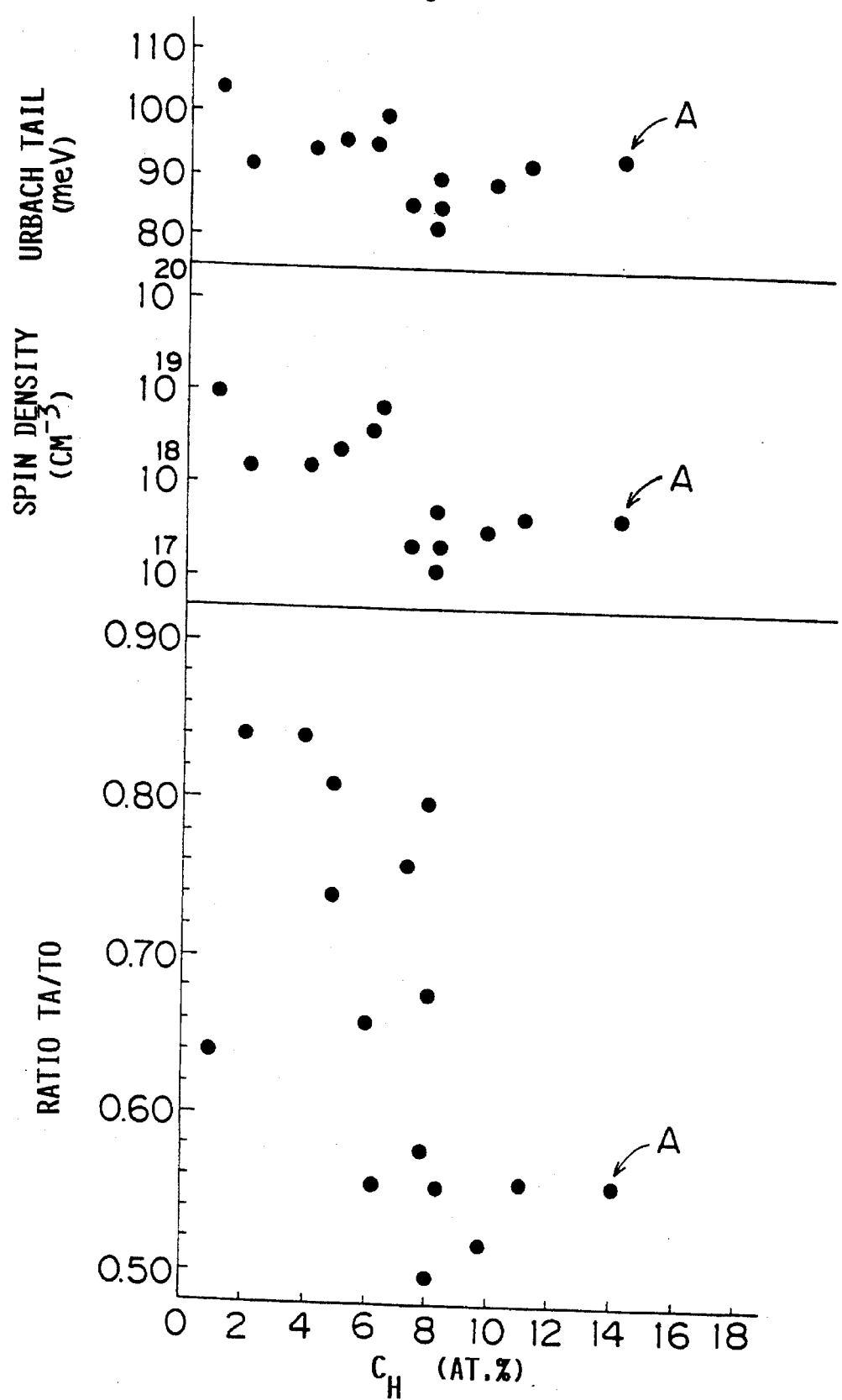
FIG. 3 shows physical properties of amorphous silicon films in Examples according to the present invention.

The physical properties of an amorphous silicon film which is employed as a starting material in the method according to the present invention will now be described. FIG. 3 shows the relationships between the hydrogen contents $C_H$ of amorphous silicon films and the TA/TO ratios of these films, as well as spin density values and Urbach tail quantities in the respective amorphous silicon films. Each of the amorphous silicon films shown in FIG. 3 was formed under conditions of an $SiH_4$ or $Si_2H_6$ gas flow rate of 40 to 100 sccm, a substrate temperature of 400° to 500° C., high-frequency power of 50 to 200 mW/cm², and a gas pressure of 77 to 200 Pa during the reaction, equally to the amorphous silicon films shown in FIG. 1 having TA/TO ratios of 0.5 to 0.8 and a hydrogen content $C_H$ exceeding 1 atomic percent.

Figure 4:
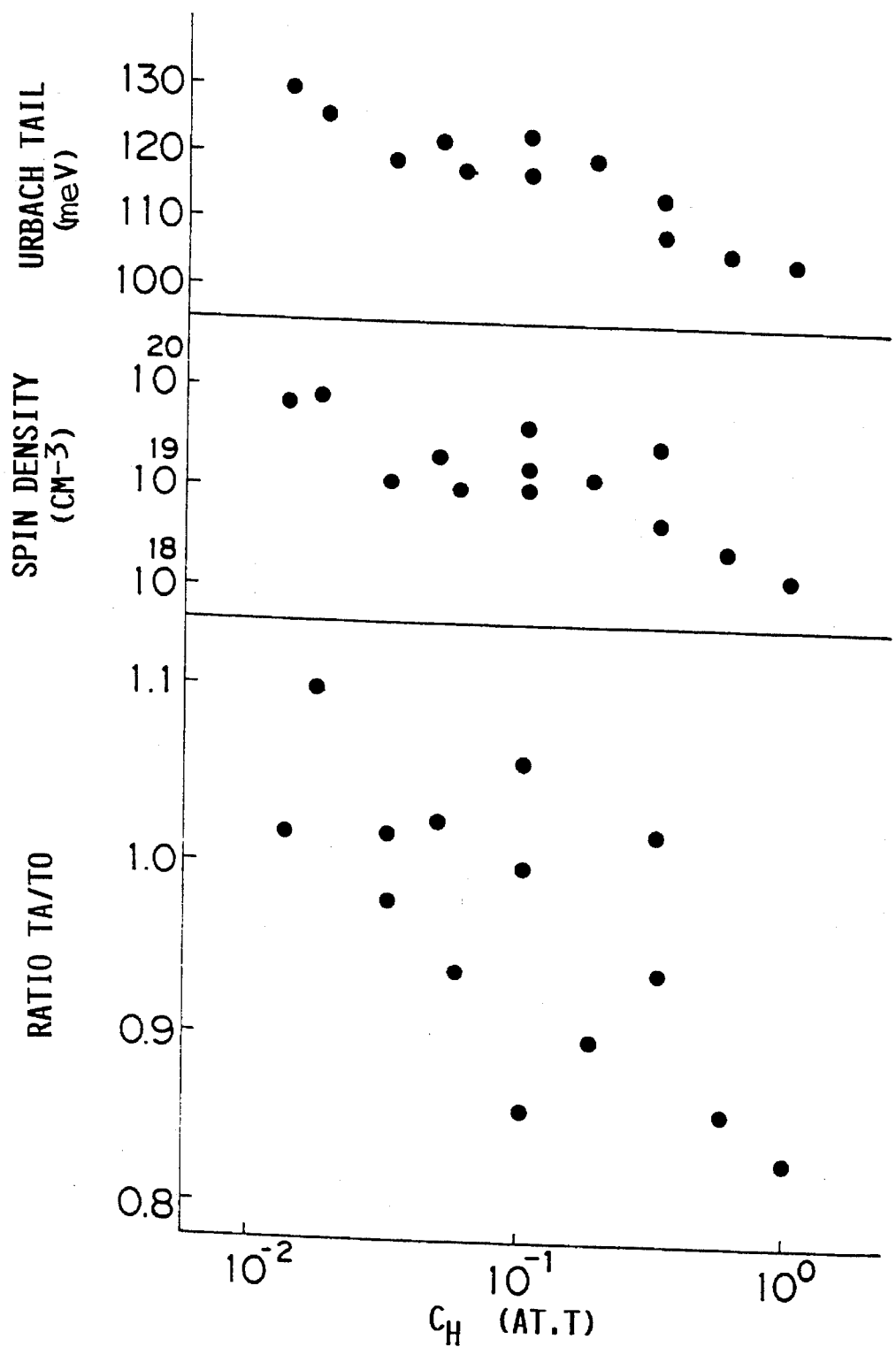
FIG. 4 shows physical properties of amorphous silicon films in further Examples according to the present invention.

FIGS. 3 and 4 illustrate amorphous silicon materials that can be used as starting materials according to the invention.

FIG. 3 shows that a sample A has a hydrogen content of about 14 atomic percent and a TA/TO ratio of about 0.56, with a spin density of about $5 \times 10^{17}$ cm⁻³ and an Urbach tail quantity of about 92 meV.

The spin density of each amorphous silicon film was measured by electron spin resonance (ESR), and the Urbach tail quantity was measured by photothermal deflection spectroscopy (PDS).

As shown in FIG. 3, no clear correlations are recognized between the TA/TO ratios and the hydrogen contents in the amorphous silicon films. However, the spin density values are within a range of $10^{17}$ to $10^{19}$ cm⁻³ and the Urbach tail quantities are within a range of about 80 to 110 meV. An amorphous silicon film which is generally applied to a solar battery has a spin density in a range of $1 \times 10^{15}$ to $1 \times 10^{16}$ cm⁻³ and an Urbach tail quantity in a range of about 40 to 50 meV. Thus, each amorphous silicon film shown in FIG. 3 can be regarded as being lower in quality as compared with the amorphous silicon film which is conventionally applied to a solar battery.

FIG. 4 shows physical properties of amorphous silicon films, each of which was formed under conditions of an $SiH_4$ or $Si_2H_6$ gas flow rate of 60 to 200 sccm, a substrate temperature of 400° to 550° C., high-frequency power of 200 to 500 mW/cm², and a gas pressure of 200 to 1500 Pa during the reaction, similarly to the amorphous silicon films shown in FIG. 1 having TA/TO ratios of at least 0.8 and a hydrogen content $C_H$ of less than 1 atomic percent. As shown in FIG. 4, the hydrogen content $C_H$ of these films is within a range of $10^{-2}$ to 1 atomic percent, and the TA/TO ratios are within a range of 0.8 to 1.1. Further, spin density values are within a range of $10^{18}$ to $10^{20,}$ and Urbach tail quantities are within a range of about 100 to about 130 meV. Thus, each of the amorphous silicon films shown in FIG. 4 can also be regarded as being lower in quality as compared with the amorphous silicon film which is conventionally applied to a solar battery.

A photovoltaic device employing a polycrystalline silicon film prepared according to the present invention as a photoelectric conversion layer, will now be described.

Figure 5:
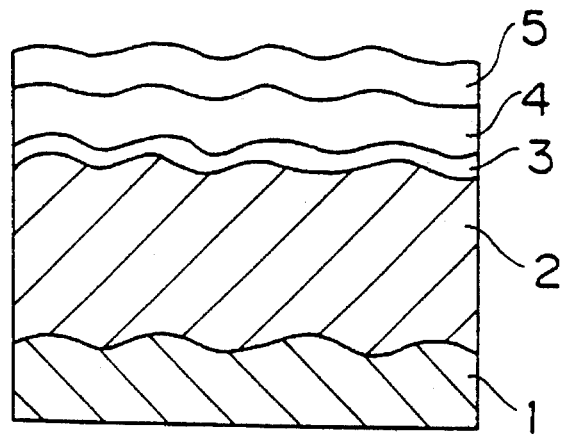
FIG. 5 is a sectional view showing the structure of a photovoltaic device employing a polycrystalline silicon film which is formed according to the present invention as a photoelectric conversion layer.

FIG. 5 is a sectional view showing an element structure of such a photovoltaic device. Referring to FIG. 5, a metal substrate 1 of stainless steel or tungsten has a textured surface, which is provided thereon with a polycrystalline silicon film 2 formed according to the present invention. This polycrystalline silicon film 2 is so formed as to serve as an n⁻-type semiconductor. An intrinsic amorphous silicon film 3 is formed on the polycrystalline silicon film 2, and a p-type amorphous silicon film 4, which has a polarity opposite to that of the polycrystalline silicon film 2, is formed on the intrinsic amorphous silicon film 3. A transparent conductive film 5 of indium tin oxide or tin oxide is formed on the p-type amorphous silicon film 2, in order to allow incidence of light.

In a practically prepared sample of such a photovoltaic device, the intrinsic amorphous silicon film 3 and the p-type amorphous silicon film 4 were formed by plasma CVD. On the other hand, an amorphous silicon film, serving as a starting material for the polycrystalline silicon film 2, was formed by plasma CVD under conditions of an $SiH_4$ gas flow rate of 20 to 200 sccm, a substrate temperature of 400° to 600° C., high-frequency power of 40 to 500 mW/cm², and a gas pressure of 13.3 to 1500 Pa during the reaction. The as-obtained amorphous silicon film had a TA/TO ratio of about 0.7 and a hydrogen content of about 8 atomic percent. This amorphous silicon film was heat treated as a starting material to form the polycrystalline silicon film 2.

Figure 6:
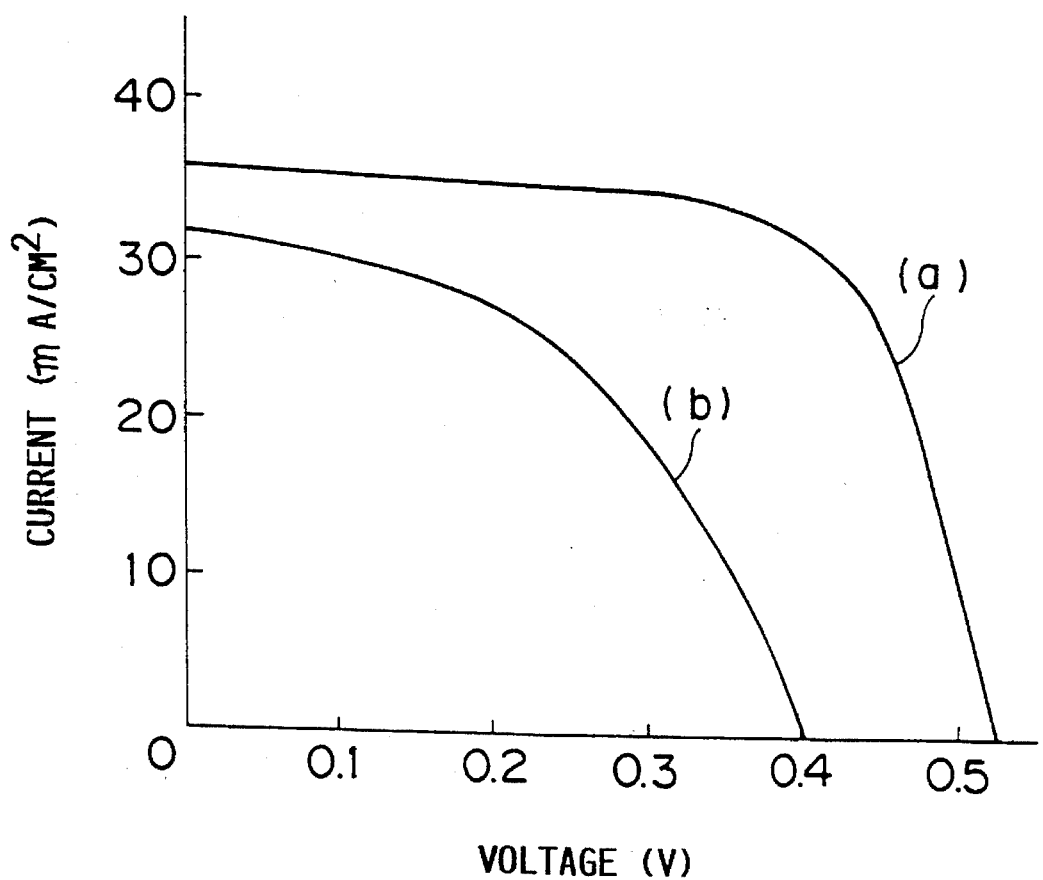
FIG. 6 shows photoelectric conversion characteristics of the photovoltaic device shown in FIG. 5.
Figure 7:
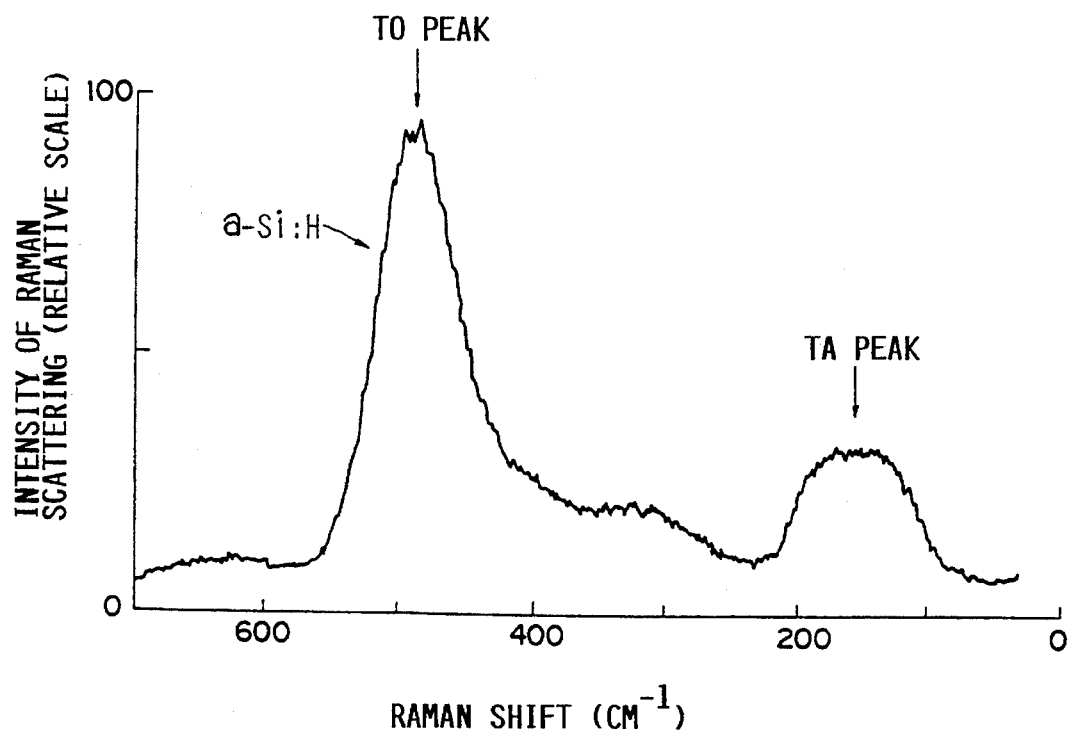
FIG. 7 illustrates a typical Raman spectrum of an amorphous silicon film.

FIG. 6 illustrates the current-voltage characteristics of the photovoltaic device obtained in the aforementioned manner. Referring to FIG. 6, symbol (a) shows a current-voltage curve of the photovoltaic device employing the polycrystalline silicon film prepared from the aforementioned amorphous silicon film, having a TA/TO ratio of about 0.7, serving as a starting material. On the other hand, symbol (b) shows a current-voltage curve of a photovoltaic device prepared as a comparative example. A polycrystalline silicon film of the photovoltaic device according to the comparative example was prepared from an amorphous silicon film, serving as a starting material, having a TA/TO ratio of about 0.4 and a hydrogen content of about 8 atomic percent.

It is clearly understood from FIG. 6 that the open circuit voltage (V) is improved and the fill factor is very much improved when the polycrystalline silicon film formed according to the present invention is employed. More specifically, the photovoltaic device of the invention in FIG. 6 has an open circuit voltage of at least 0.5 volts, a short-circuit current of at least 35 mA/cm² and a voltage-current characteristic curve with a current greater than 30 mA/cm² at a voltage greater than 0.4 volts. This improvement is believed to be achieved by the invention because the carrier mobility is improved whereby the distances of diffusion of the carriers is increased, thereby improving the photoelectric conversion characteristics.

While the above Examples have been described with reference to amorphous silicon films, serving as starting materials, formed by plasma CVD, the present invention is not restricted to such a film forming method but the amorphous silicon film may alternatively be formed by another thin film forming method such as low pressure CVD, normal pressure CVD or the like. Further, hydrogen may be introduced into the as-formed amorphous silicon film by an after step such as hydrogen plasma treatment, to obtain the amorphous silicon film according to the present invention.

The supporting substrate to be provided with the amorphous silicon film may not necessarily have a flat surface, but its surface may be textured. It has been confirmed that, when the surface of the substrate is textured, the crystal grain sizes are increased in the polycrystalline silicon film due to such texture, to further improve the carrier mobility.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic device comprising a polycrystalline silicon film as a photoelectric conversion layer, said polycrystalline silicon film having been formed by providing an amorphous silicon film containing hydrogen and having an intensity ratio TA/TO of at least 0.5 of a TA peak intensity relative to a TO peak intensity in a Raman spectrum, and heat treating said amorphous silicon film for converting said amorphous silicon film to said polycrystalline silicon film.

2. The photovoltaic device of claim 1, having an open circuit voltage of at least 0.5 volts and a short-circuit current of at least 35 mA/cm².

3. The photovoltaic device of claim 2, having a voltage-current characteristic curve with a current greater than 30 mA/cm² at a voltage greater than 0.4 volts.

4. A polycrystalline silicon film useful as a photoelectric conversion layer in a photovoltaic device, said polycrystalline silicon film having been formed by providing on a substrate an amorphous silicon film containing hydrogen and having an intensity ratio TA/TO of at least 0.5 of a TA peak intensity relative to a TO peak intensity in a Raman spectrum, and heat treating said amorphous silicon film for converting said amorphous silicon film to said polycrystalline silicon film.

5. The polycrystalline silicon film of claim 4, having a mean grain size of at least about 1.3 μm and having a carrier mobility of at least about $10^{2.75}$ cm²/V.S.

6. The polycrystalline silicon film of claim 4, wherein the content of said hydrogen in said amorphous silicon film is greater than 1 atomic percent, and said TA/TO ratio is within the range from 0.5 to 0.8.

7. The polycrystalline silicon film of claim 6, wherein said amorphous silicon film has a spin density within the range from $10^{17}$ to $10^{19}$ cm⁻³ and an Urbach tail quantity within the range from about 80 to about 110 meV.

8. The polycrystalline silicon film of claim 6, having a mean grain size within the range from about 1.3μm to about 8μm and having a carrier mobility within the range from about $10^{2.75}$ cm²/V.S to about $10^3$ cm²/V.S.

9. The polycrystalline silicon film of claim 4, wherein the content of said hydrogen in said amorphous silicon film is not greater than 1 atomic percent, and said TA/TO ratio is at least 0.8.

10. The polycrystalline silicon film of claim 9, wherein said amorphous silicon film has a spin density within the range from $10^{18}$ to $10^{20}$ cm⁻³ and an Urbach tail quantity within the range from about 100 to about 130 meV.

11. The polycrystalline silicon film of claim 9, having a mean grain size within the range from about 9.1 μm to about 18 μm and having a carrier mobility within the range from about $10^{3.1}$ cm²/V.S to about $10^{3.2}$ cm²/V.S.

12. The polycrystalline silicon film of claim 4, wherein said heat treating of said amorphous silicon film is carried out in a nonoxidizing atmosphere at a temperature within the range from 550° C. to 800° C.

13. A photovoltaic device comprising a polycrystalline silicon film as a photoelectric conversion layer, wherein said polycrystalline silicon film has a mean grain size of at least about 1.3 μm and a carrier mobility of at least about $10^{2.75}$ cm$^2$/V.S.

14. The photovoltaic device of claim 13, wherein said polycrystalline silicon film has a mean grain size within the range from about 1.3 μm to about 8 μm and has a carrier mobility within the range from about $10^{2.75}$ cm$^2$/V.S to about $10^3$ cm$^2$/V.S.

15. The photovoltaic device of claim 13, wherein said polycrystalline silicon film has a mean grain size within the range from about 9.1 μm to about 18 μm and has a carrier mobility within the range from about $10^{3.1}$ cm$^2$/V.S to about $10^{3.2}$ cm$^2$/V.S.

16. The photovoltaic device of claim 13, having an open circuit voltage of at least 0.5 volts and a short-circuit current of at least 35 mA/cm$^2$.

17. The photovoltaic device of claim 16, having a voltage-current characteristic curve with a current greater than 30 mA/cm$^2$ at a voltage greater than 0.4 volts.

* * * * *

UNITED STATES PATENT AND TRADEMARK OFFICE
CERTIFICATE OF CORRECTION

PATENT NO. : 5,492,142
DATED : Feb. 20, 1996
INVENTOR(S) : Keiichi Sano

It is certified that error appears in the above-identified patent and that said Letters Patent is hereby corrected as shown below:

Column 2, line 6, replace "2000 $cm^{-a}$" by --2000 $cm^{-1}$--;
Column 3, line 11, replace "20 $mW/cm^2$" by --200 $mW/cm^2$--;
Column 4, line 19, replace "500°" by --550°--;
Column 6, line 36, line 48 (both occurrences) and line 60 (both occurrences) replace "V.S" by --V·s--;
Column 7, line 2, line 6 and line 7, replace "V.S" by --V·s--;
Column 8, line 1 and line 2, replace "V.S" by --V·s--.

Signed and Sealed this

Eleventh Day of June, 1996

BRUCE LEHMAN

*Attest:*

*Attesting Officer*  Commissioner of Patents and Trademarks